United States Patent [19]

Leedy et al.

[11] 3,858,304

[45] Jan. 7, 1975

[54] PROCESS FOR FABRICATING SMALL GEOMETRY SEMICONDUCTOR DEVICES

[75] Inventors: Hayden M. Leedy; Loren G. McCray, Jr., both of Thousand Oaks; Harry L. Stover, Newberry Park, all of Calif.

[73] Assignee: Hughes Aircraft Company, Culver City, Calif.

[22] Filed: Jan. 30, 1974

[21] Appl. No.: 438,081

Related U.S. Application Data

[62] Division of Ser. No. 282,536, Aug. 21, 1972, abandoned.

[52] U.S. Cl. ........................ 29/578, 29/591, 357/91, 357/15, 96/36.2

[51] Int. Cl. .............................................. B01j 17/00

[58] Field of Search .......... 29/578, 576 B, 589, 591; 148/1.5; 317/235 UA; 96/36.2; 357/91

[56] References Cited

UNITED STATES PATENTS

| | | | |
|---|---|---|---|
| 3,266,127 | 8/1966 | Harding | 29/578 |
| 3,537,921 | 11/1970 | Boland | 29/578 |
| 3,616,380 | 10/1971 | Lepselter | 317/235 UA |
| 3,733,527 | 5/1973 | Migitaka | 148/1.5 DD |

*Primary Examiner*—Roy Lake
*Assistant Examiner*—W. Tupman
*Attorney, Agent, or Firm*—William J. Bethurum; W. H. MacAllister

[57] ABSTRACT

A process for fabricating small geometry semiconductor devices wherein an active region or regions are formed in a semiconductive layer and metalization patterns are formed on the surface thereof, while a resist pattern used to define the geometry of these regions and patterns is left temporarily in place between metal and semiconductor. Then, the resist is lifted off the surface of the oxide located between the metal and the semiconductive layer and whose geometry it controlled carrying with it the metalization lying on the resist surface and leaving very narrow strips of metalization in contact with the active regions.

2 Claims, 13 Drawing Figures

PROCESS FOR FABRICATING SMALL GEOMETRY SEMICONDUCTOR DEVICES

Figure 1A:
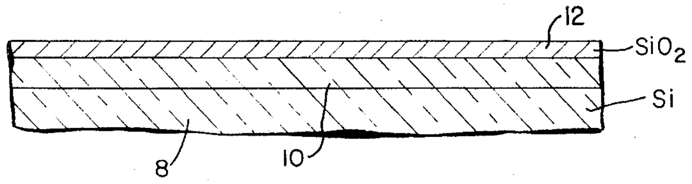

This is a division of application Ser. No. 282,536, filed Aug. 21, 1972 and now abandoned.

FIELD OF THE INVENTION

This invention relates generally to the fabrication of small geometry planar semiconductor devices and more particularly to a relatively low temperature fabrication process which requires a minimum of photolithographic masking steps in the fabrication of said devices.

BACKGROUND

In fabrication of semiconductor devices using conventional photolithographic techniques, it has been a common practice to utilize insulating layers, such as the oxides and nitrides of silicon, as masks and barriers to impurity diffusions into semiconductor wafers. These masks are used as a means for controlling and limiting the lateral extent of these diffusions in order to define the geometries of a wide range of semiconductor devices and monolithic integrated circuits. In the development of these oxide and nitride masks, it has been a common practice to provide additional covering masks, such as photoresist masks, to cover the insulating layers and thus expose only certain selected regions of the insulating layers during the process of the diffusion mask formation. These latter regions can then subsequently be exposed to selected oxide and nitride etchants which will preferentially etch the latter and thereby expose the underlying silicon semiconductor material, while leaving intact the portions of the insulating layer beneath the covering resist masks.

PRIOR ART

Hitherto, as a result of the high temperatures involved in alloying and diffusing impurities into semiconductors in order to form active regions and PN junctions therein, it was necessary to remove, usually by lifting with a suitable solvent soak etchant, the resist mask from the oxide or nitride surfaces prior to carrying out an alloying or diffusion step. For example, if any resist layer is left intact on the oxide surface during an impurity diffusion, it will melt and contaminate the entire diffusion process as a result of the elevated diffusion temperatures required, typically in the order of 1100°C. Therefore, using the above process and prior to alloying or diffusing impurities through openings in the above oxide mask, it is necessary to remove any resist mask from the surface of the oxide mask. Thus, after a diffusion step is completed, the above multiple steps of forming both resist and oxide masks must be repeated for subsequent diffusions. Furthermore, after the completion of these multiple diffusions, it may be necessary to form additional resist and oxide masks on the semiconductor surface as part of the metal deposition process wherein contact metalization is applied to the active regions of the semiconductor device being fabricated. After the latter oxide mask is formed with openings therein for receiving ohmic contact metalization, the resist is etched away so that metalization patterns can be evaporated as a thin film over the exposed oxide and semiconductor surfaces.

While the above prior art photolithographic processes have been adequate for the fabrication of certain types and sizes of semiconductive devices and integrated circuits, they have not been totally satisfactory in the fabrication of certain very small geometry, high frequency semiconductor devices, such as Schottky barrier microwave diodes. As a result of tight mask registration requirements for fabricating the latter devices, it has not always been possible, using the above process, to reduce the metalization patterns down to desired small line widths. The multiple masking processes defined above merely do not permit the practical and commercial reduction in line widths less than about 2–3 microns, which is not a sufficient geometry reduction for certain high frequency semiconductor devices.

THE INVENTION

The general purpose of this invention is to provide a new and improved semiconductor device fabrication process having all of the advantages of similarly employed prior art semiconductor processes, and yet requiring only a single oxide masking step for providing both geometry control of active regions in a semiconductive layer and geometry control of an overlay metalization for making metal ohmic contacts to these active regions. To attain this purpose, a unique process combination of resist, oxide masking and metalization steps are utilized in such a manner that only a single oxide mask is formed on the surface of a semiconductive layer. A resist mask, which is formed on top of this oxide mask, is allowed to remain intact during the formation of active regions in the semiconductive layer, and it is further allowed to remain intact during a subsequent metalization step. Due to the fact that the processes used for forming the active device regions do not generate excessive heat in the semiconductive layer or the above thin layers thereon, this resist layer can be left temporarily in place during all of the above process steps. Upon the completion of the contact metalization step, the resist layer is lifted off of the oxide mask supporting it, carrying with it any overlying metalization and leaving only very narrow ohmic contact strips adhering to the active regions of the semiconductive layer. In accordance with the present invention, it has been discovered that in the fabrication of very small geometry devices, this resist layer can be removed to simultaneously remove the contact metalization thereon without leaving any ragged edges on the lines of metalization which remain in ohmic contact with the semiconductive layer.

Accordingly, an object of this invention is to provide a new and improved process for fabricating small geometry, high frequency semiconductive devices and integrated circuits.

Another object is to provide a fabrication process of the type described which requires a minimum number of photomasking steps and which may be carried out at high yields to provide semiconductive devices and integrated circuits which are durable and reliable in operation.

Another object is to provide a fabrication process of the type described which may be rapidly carried to completion in comparison to the multiple photomasking processes of the prior art.

DRAWING

FIGS. 1*a* through 1*g* illustrate, in cross-section and in process sequence, the successive fabrication steps utilized in one embodiment of the invention; and FIGS. 2a–2f illustrate, in cross-section and in process sequence, the fabrication steps utilized in another embodiment of the invention.

GENERAL PROCESS DESCRIPTION

Referring now to FIG. 1a there is shown a semiconductor substrate 8, which may be typically a silicon wafer of the order of 0.001 ohm centimeters. The upper surface of the silicon substrate 8 is initially lapped and polished using conventional semiconductor processing techniques, and thereafter an epitaxial silicon layer 10 of approximately 0.1 ohm.centimeter resistivity is deposited thereon using, for example, the well-known silane process for thermally decomposing silane, $SiH_4$, at approximately 1,000°C. Next, an insulating coating 12, such as silicon dioxide ($SiO_2$), is formed on the epitaxial layer 10 as shown. The oxide coating 12 may be formed, for example, either by introducing oxygen into the silane process or by using low temperature glass deposition techniques. In case of the latter, the well-known spin-on glass processes may advantageously be used in the formation of the $SiO_2$ layer 12, and in these processes a homogeneous, low viscosity silica film is applied to the surface of the epitaxial layer 10. These low temperature glasses may be spun on the surface of the epitaxial layer 10 by rotating the substrate 10 and simultaneously dropping the liquid silica on the epitaxial layer 10. These glasses are then heated to relatively low temperatures in the order of 350°–400°C to form the $SiO_2$ coating 14.

Figure 1B:
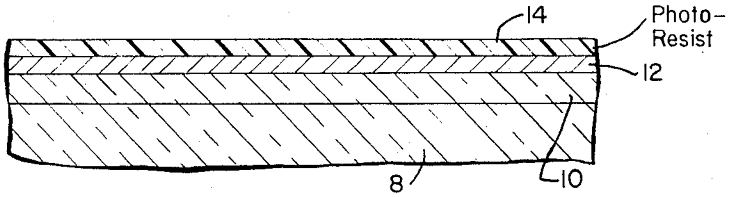
Figure 1C:
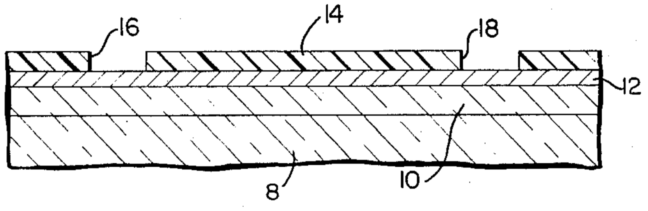

Next, a layer of suitable resist material 14, such as the well-known Kodak Metal Etch Resist (KMER) is deposited on the $SiO_2$ layer 12 as shown in FIG. 1b. The resist layer 14 is then patterned by exposing selected regions thereof to ultra-violet light to thereby harden these regions so they will remain intact during the subsequent etching step. The unexposed resist regions are then washed away using a suitable solvent, such as trichloroethylene, to thereby create openings 16 and 18 as shown in the resist pattern 14. It is to be understood that the term "resist" as used herein means any suitable masking material which can be deposited on the surface of the insulating layer 12 and developed by any suitable exposure technique to form openings, such as openings 16 and 18 therein. Ultraviolet light is used to expose and polymerize KMER photoresist, and the unexposed photoresist may be washed away with the above mentioned solvent or a Kodak developer. As will be seen below with reference to FIG. 2, an electron beam resist material, such as polymethylmethacrilate (PMM), may be used alternatively as the resist layer 14, and the portions of this layer 14 which are selectively exposed to an electron beam may be removed using a solvent such as methylisobutyl ketone to form the openings 16 and 18 therein. PMM is known as a positive resist material, since the portions thereof which are exposed are removed, whereas KMER is a negative resist material, since the unexposed KMER is removed.

Figure 1D:
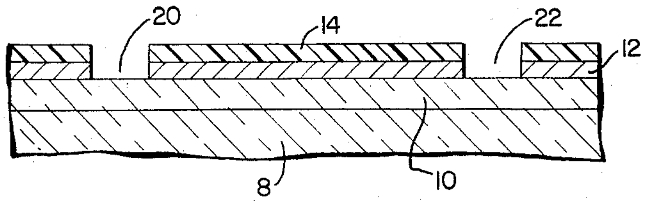

The next step in the process is to etch away portions of the $SiO_2$ layer 14 in the regions 20 and 22 indicated in FIG. 1d, and these regions may be etched away using a preferential etchant such as a buffered hydrofluoric acid. Once the $SiO_2$ is removed from regions 20 and 22, the structure of FIG. 1d may be transferred to an ion implantation chamber wherein either P or N type ion beams 24 and 26 are suitably focused on the open areas of the silicon epitaxial layer 10 (see FIG. 1e) to modify the impurity concentration in regions 28 and 30 and form the planar PN junctions indicated. Ion implantation processes are generally well-known in the art and involve ionizing impurity atoms such as boron and phosphorous before accelerating these ions by an electric field into the crystal lattice of the exposed semiconductor substrate. Thus, these processes will not be described herein in detail.

Figure 1E:
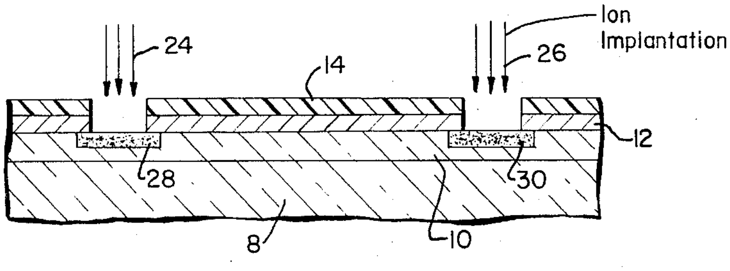

It should be observed here that, contrary to prior art diffusion and alloying processes, the resist coating 14 remains in place as shown in FIG. 1e during the entire ion implantation process mentioned above. Since a low temperature ion implantation process is advantageously used to dope the epitaxial layer 10, the various layers of the substructure shown in FIG. 1e are not excessively heated, and there is no melting or running of the resit layer 14 during the ion implantation process.

Figure 1F:
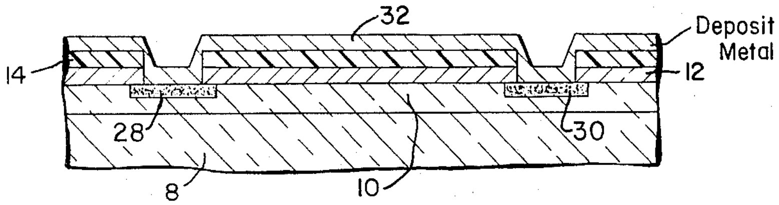
Figure 1G:
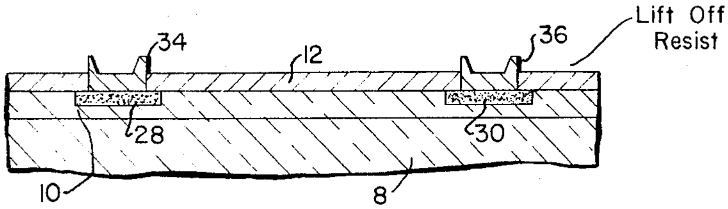

After the completion of the above ion implantation process, a layer 32 of metalization, such as aluminum, is vacuum deposited as shown, using conventional aluminum evaporation techniques, to form the thin metal film 32 which extends over the exposed areas of the photoresist layer 14 and into ohmic electrical contact with the active regions 28 and 30 of the semiconductor device or integrated circuit being fabricated. Once the metalization layer 32 is suitably adherent to the active regions 28 and 30 of the epitaxial layer 10, the photoresist layer 14 may be stripped or etched away using a suitable reagent to thereby remove portions of the metalization layer 32 which overlie the remaining photoresist 14 as shown in FIG. 1f. After the removal of the photoresist layer 14, very narrow metal ohmic contacts 34 and 36, in the order of 0.2–0.3 microns, remain intact as shown in FIG. 1g, and the above removal of the photoresist 14 leaves no ragged edges on these metalization contacts. The contacts 34 and 36 may be geometrically formed as straight lines, annular rings, or various other geometries of the device engineer's choosing, and the structure of FIG. 1g may then be diced or further processed in accordance with conventional monolithic semiconductor fabrication techniques.

Thus, there has been described a novel semiconductor fabrication process wherein only a single oxide masking step is required: for (1) controlling the geometries of the active regions 28 and 30 and for (2) determining the precise locations of the ohmic contacts made thereto, as previously described. Where planar PN junctions are formed as shown in FIGS. 1e, 1f and 1g above, these junctions will extend laterally beneath and to the surface of the oxide layer 12 as a result of the fringing effects of the ion implantation process and there be oxide passivated. If it is desired to further increase the lateral extent of the PN junctions in the epitaxial layer 10, then the width of the ion beams 24 and 26 may be increased to penetrate through both the resist and silicon dioxide layers 14 and 12 and into the surface of the epitaxial layer 10. Where this latter technique is used, the junction depths will be greater beneath the oxide openings 20 and 22 than in regions laterally removed therefrom.

Referring now to FIGS. 2a–2f, the process illustrated here differs from the process described in FIG. 1 above in that: (1) PMM electron beam resist 14' is used rather than photoresist 14 and (2) a Schottky barrier is formed (no ion-implantation) rather than an ion-implanted PN planar junction. This process illustration in FIGS. 2*a*–2*f* is intended to show that the present invention is not to be restricted to forming PN junctions by ion implantation and is not restricted to the use of any particular resist material. Thus, the term "active region" as used herein includes both a region doped by ion implantation as well as a Schottky barrier region formed by metal-to-semiconductor bonding.

Figure 2A:
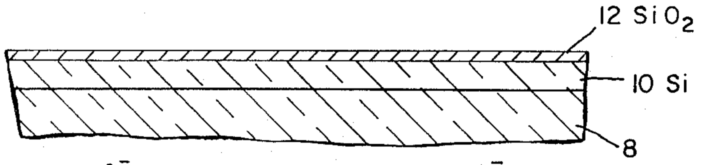
Figure 2B:
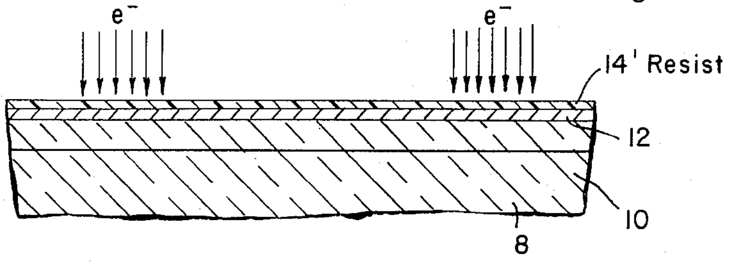
Figure 2C:
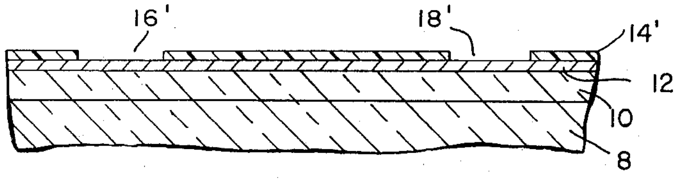

In FIG. 2*a*, and $SiO_2$ layer 12 is either thermally grown or deposited as a thin uniform film on the epitaxial layer 10, and this layer 12 subsequently covered (FIG. 2*b*) with a polymethylmethacrilate (PMM) electron beam resist layer 14'. By focusing the electron beams 15 as shown on selected exposed regions of the PMM layer 14', the regions exposed are chemically altered so they may be subsequently chemically etched away with a suitable etchant, such as methylisobutyl ketone.

Figure 2D:
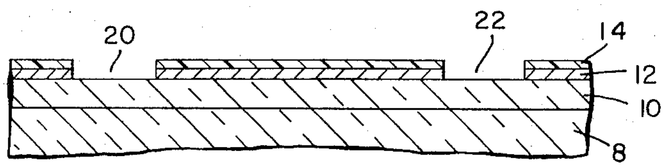

Next, the $SiO_2$ in regions 20 and 22 may be removed using a buffered HF solution to expose the surfaces of the epitaxial layer 10 as shown in FIG. 2*d*.

Figure 2E:
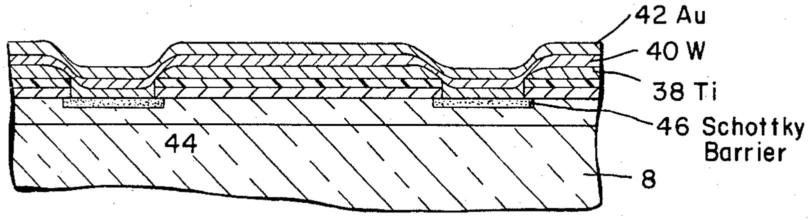

In FIG. 2*e* the multiple layers of Schottky barrier and ohmic contact metalization are formed and include a first Schottky barrier layer 38 of titanium, T, a second intermediate layer 40 of tungsten, W, and a third top layer 42 of gold. The first layer 38 of titanium is best suited for forming the Schottky barrier with the epitaxial layer 10, whereas the gold layer 42 is best suited for making ohmic bonds to other devices. But as a result of the thermal expansion mismatch between Au and T, a layer 40 of tungsten W is interposed as shown between the layers 38 and 42 and provides a good secure metal bond between the top gold contact layer 42 and the titanium layer 38. All of the above three layers of metalization may be formed using a multi-hearth electron gun evaporator.

Figure 2F:
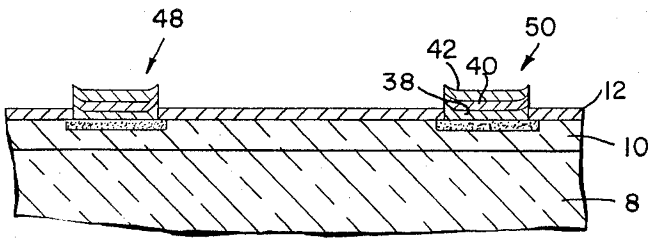

Next, the unexposed resist layer 14' may be washed away with a solvent such as trichloroethylene, carrying with it the metal on the upper surface of the resist 14' and leaving the metal contacts as shown in FIG. 2*f*. The structure in FIG. 2*f* may be further processed using conventional semiconductor processing techniques (not shown) to lap the back (lower) side of the low resistivity N+ silicon substrate 8, apply suitable contact metalization thereto, and then scribe and break the substrate along predetermined lines, such as between the metal contacts 48 and 50, to provide individual Schottky barrier diodes.

The following is a specific example of a process according to the invention which has been successfully used in the fabrication of Schottky barrier devices. This example follows the process illustrated in FIGS. 2*a*–2*f* above, with the exception that Kodak Thin Film Resist (KTFR) photoresist was used for layer 14' instead of the electron beam resist.

EXAMPLE

An N+ silicon substrate of 10 mils in thickness and 0,001 ohm.centimeters resistivity was lapped and polished on the upper surface thereof and placed in an epitaxial reactor where an epitaxial layer of 1,000 angstroms thickness and of 0.1 ohm.centimeters resistivity was deposited by thermally decomposing silane, $SiH_4$, at approximately 1,000°C. Next, a controlled amount of oxygen was introduced into the above silane process so that $SiO_2$ rather than Si was formed atop the Si epitaxial layer, and the $SiO_2$ layer was approximately 3,000 angstroms in thickness. Next, a negative resist layer of Kodak Thin Film Resist (KTFR) was applied to the upper surface of the silicon dioxide layer and selected areas of this KTFR photoresist layer were exposed to ultraviolet light, whereafter the unexposed areas of the KTFR layer were washed away using "Kodak Developer." This developer is a proprietary solvent and may, like the KTFR, be obtained from the Eastman Kodak Company of Rochester, N.Y. Thereafter, the exposed regions of the $SiO_2$ layer were removed by ion beam machining using the process described in copending application Ser. No. 272,518 assigned to the present assignee. Using this ion beam machining, oxide line widths of approximately 0.2–0.3 microns were formed in the $SiO_2$ layer, leaving epitaxial layer areas of this small dimension exposed for a subsequent metalization step. In this metalization step, a multi-hearth electron gun evaporator was used and held approximately 10 inches above the developed resist layer to initially deposit a thin layer of titanium of approximately 1,500 angstroms in thickness on the exposed surfaces of the epitaxial silicon and its partially covering $SiO_2$ layer. Next, using the same evaporator, a thin layer of tungsten of approximtely 500 angstroms in thickness was deposited on the titanium layer, and thereafter a thin layer of gold of approximately 1,500 angstroms in thickness was deposited on the surface of the tungsten layer. A Sloan thickness monitor was used to monitor the thicknesses of the above three layers of metalization, and after the deposition of the gold layer was completed, the metalization layers were allowed to cool at room temperatures and become adherent to and firmly secured to the epitaxial silicon layer. Next, a reagent identified as "A-20" which is a proprietary solution obtainable from the Shipley Corporation of Newton, Massachussetts was used to remove the KTFR resist, leaving intact only portions of the above metalization layers over the active regions formed in the epitaxial layer. Then the lower or reverse side of the low resistivity N+ substrate was lapped until a total thickness for the substrate and epitaxial layer of approximately 3 mils was reached. Then the latter composite structure was washed in separate washing steps with hot trichloro-ethylene and alcohol, respectively, and then allowed to dry, whereafter the same three-layer metalization process used to metalize the top surface of the epitaxial layer was used to form metal ohmic contacts to the N+ substrate. Next, the structure was scribed and broken into individual dice, each containing the Schottky barrier PN diodes described.

It was found during the above process that the relatively low temperatures to which the above composite structure was subjected during ion implantation and ion beam machining did not have the effect of causing the KTFR resist to polymerize to any significant degree, and thus this resist was readily removed using the above "A-20" reagent. The ion beam machining process may, in some instances, raise the temperature of the composite structure to as much as 150°C, possibly the hottest part of the entire process, including the ion implantation process which can raise the temperature of the structure to the order of 100°–150°C. And it is also known that KTFR will begin to polymerize at 90°C. But it was found that, even after ion beam machining as described above for approximately 3 hours to remove portions of the $SiO_2$ layer, this time and temperature did not have the effect of making the developed KTFR resist difficult to remove. Furthermore, a positive resist identified as AZ-1350-H sold by the Shipley Corporation of Newton, Massachussetts has been found to work equally well with the above process and associate temperatures, and this positive resist has been readily removed after the metalization step (the unexposed portions thereof) with the above-identified "A-20" reagent.

What is claimed is:

1. A method of making semiconductor devices including the steps of:

a. forming an insulating coating on the surface of a layer of semiconductive material;
b. forming a resist pattern on said insulating coating;
c. removing selected regions of said insulating coating which are exposed by openings in said resist pattern, thereby exposing an area or areas of said semiconductive layer;
d. accelerating dopant ions into said exposed area or areas of said semiconductive layer and into the crystal lattice of said semiconductive layer to alter the conductivity thereof and to form planar P-N junctions in said semiconductive layer wherein said junctions terminate at said surface under said insulating coating;
e. depositing metalization on the exposed surface area of said resist pattern and into contact with the exposed area or areas of said semiconductive layer to thereby make electrical contact to said P-N junctions, and thereafter
f. removing said resist pattern from said insulating coating to thereby simultaneously remove the portion of said metalization layer overlying said resist pattern, leaving intact the metalization in electrical contact with said semiconductive layer, whereby the ion implantation temperatures utilized during the acceleration of dopant ions into the semiconductor crystal lattice are insulfficient to deleteriously affect said resist pattern.

2. The process defined in claim 1 wherein said semiconductive layer is formed by the epitaxial deposition of a relatively high resistivity epitaxial layer on a relatively low resistivity substrate, whereby said substrate may be utilized to make good ohmic electrical contact to metalization applied thereto.

* * * * *